United States Patent [19] [11] Patent Number: 4,979,787
Lichtenberger [45] Date of Patent: Dec. 25, 1990

[54] OPTICAL-ELECTRONIC INTERFACE MODULE

[75] Inventor: Philip L. Lichtenberger, Thousand Oaks, Calif.

[73] Assignee: PCO, Inc., Chatsworth, Calif.

[21] Appl. No.: 464,186

[22] Filed: Jan. 12, 1990

[51] Int. Cl.5 ............................................... G02B 6/42
[52] U.S. Cl. ..................................... 350/96.2; 361/398
[58] Field of Search ............... 361/397, 398, 400, 401; 350/96.2, 96.15; 357/74

[56] References Cited

U.S. PATENT DOCUMENTS

| | | | |
|---|---|---|---|
| 3,423,594 | 1/1969 | Galopin | 250/211 |
| 3,792,284 | 2/1974 | Kaelin | 250/551 |
| 4,251,852 | 2/1981 | Ecker et al. | 351/81 X |
| 4,273,413 | 6/1981 | Bendiksen et al. | 350/96.20 |
| 4,294,512 | 10/1981 | Logan | 350/96.20 |
| 4,342,883 | 8/1982 | Wernet et al. | 361/398 X |
| 4,539,476 | 9/1985 | Donuma et al. | 250/227 |
| 4,591,711 | 5/1986 | Taumberger | 250/227 |
| 4,647,148 | 3/1987 | Katagiri | 350/96.20 |
| 4,703,984 | 11/1987 | Mitchell, Jr. | 361/398 X |
| 4,792,879 | 12/1988 | Bauknecht et al. | 361/398 X |

OTHER PUBLICATIONS

D. K. Kam, "Module Test Socket"; IBM Technical Disclosure Bulletin; vol. 22, No. 8A, Jan. 1980; pp. 3148-3149.

Primary Examiner—John D. Lee
Assistant Examiner—John Ngo
Attorney, Agent, or Firm—A. M. Fernandez

[57] ABSTRACT

A plastic multipin connector that provides an optical-electronic interface between the end of a fiberoptic cable and an electronic circuit utilizes a flexible multilayer printed circuit with a ground plane layer on the outside of the folded circuit within a plastic housing and an upright tab intact with the ground plane layer on the outside of the tab and at least one patterned conductor layer. The upright tab is used to make connections of the optoelectronic device with the printed circuit at the base of the device leads to virtually eliminate any lead length from the device to the printed circuit that is not shielded from external noise.

13 Claims, 2 Drawing Sheets

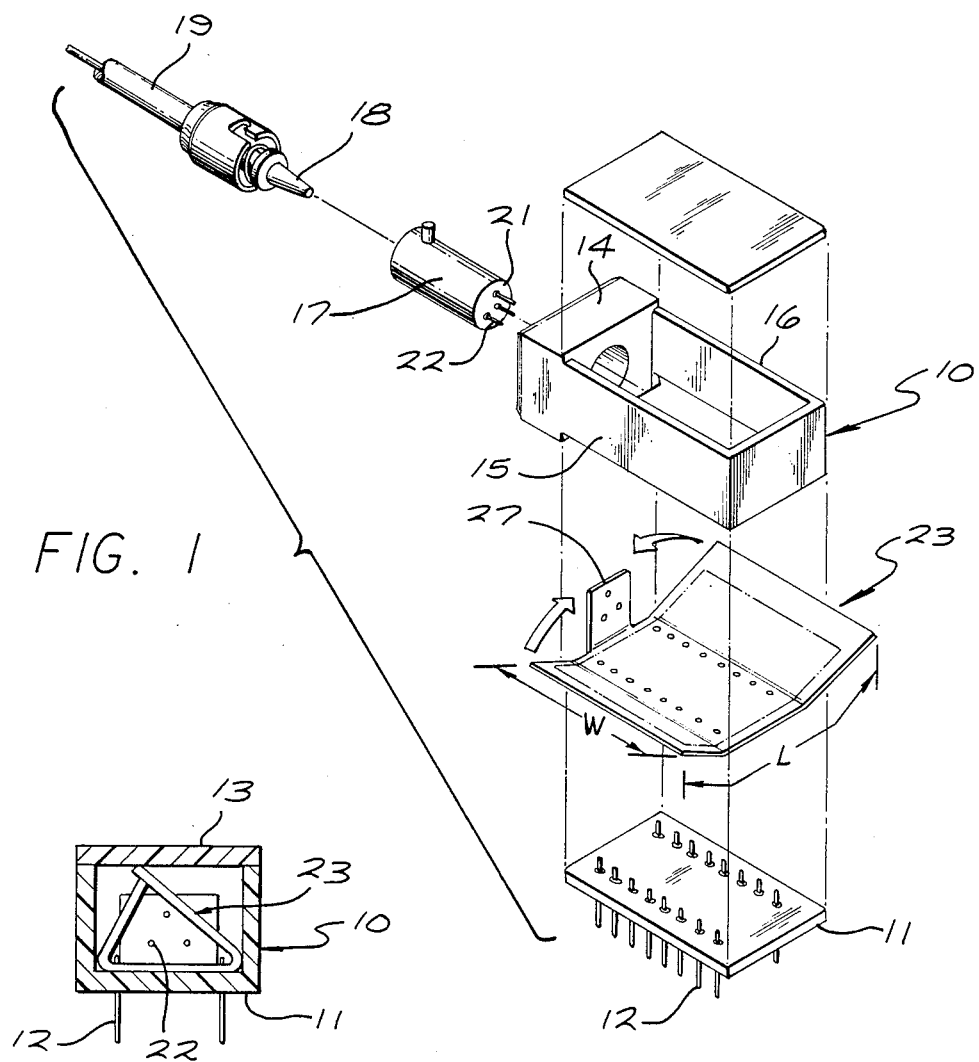
FIG. 1
FIG. 4
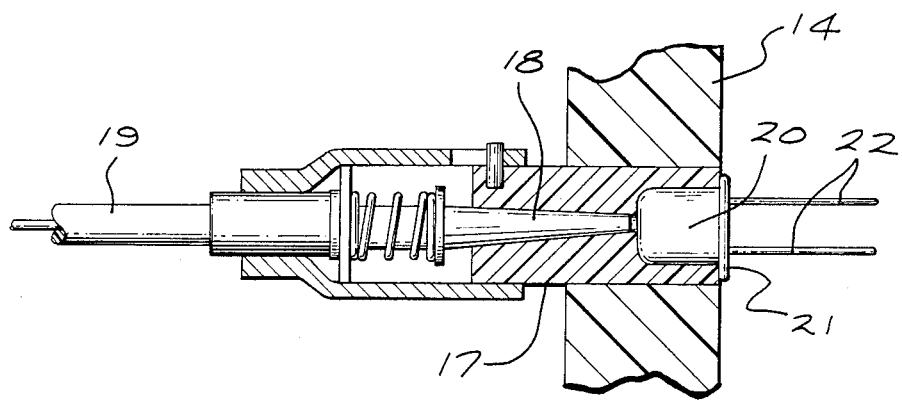
FIG. 2

OPTICAL-ELECTRONIC INTERFACE MODULE

BACKGROUND OF THE INVENTION

The invention relates to a module for interfacing the end of a fiberoptic cable with an electronic circuit for receiving or transmitting optical signals, and more particularly to such a module having a multipin housing made of nonconductive material. That electronic circuit interconnects leads of an optoelectronic device (photodiode or light emitting diode) with multiple connector pins protruding from the housing.

For such an interfacing module, it is common practice to provide a receptacle for receiving a ferrule at the end of the fiberoptic cable that supports the polished end of the optic fiber, and to spring load the ferrule in a connector at the end of a fiberoptic cable so that the polished end of the fiber will be properly positioned within the receptacle as determined by a stop in the receptacle. Once the connector is inserted into the receptacle, the polished end of the optic fiber will stop in front of a window in the optoelectronic device passing through and supported by an end wall of the housing. The fiberoptic connector and receptacle are normally provided with some means for locking the two together, usually by pushing the connector into the receptacle and turning it less than a quarter of a turn before releasing the connector.

The optoelectronic device may be contained in an enclosure, such as a TO metal can, and typically the enclosure has three or four pins protruding from its base. One is used as a positive lead (+), another as a negative lead (−), and the remaining one or two are used as ground leads. All of these optoelectronic device leads are connected to a circuit board. The electrical signal on the positive and negative leads is generally so small that extreme care must be taken to make the leads as short as possible and to shield them properly so they will not pick up electromagnetic interference (EMI), since even a small amount of EMI may so mask an electrical signal, particularly in the case of a receiver, as to render information being conveyed unreliable, particularly in the case of a photodetector being connected to a circuit board that normally has signal conditioning circuits for processing the electrical signal received before the information is to be used in an electronic system.

The tendency is to house a fiberoptic receiver or transmitter in a multipin housing made of metal, as disclosed in U.S. Pat. No. 4,647,148, for example. While such a metal housing will provide electromagnetic interference (EMI) shielding for the optoelectronic device leads and circuit, there are other problems that need to be addressed, such as size and cost. The problem of size becomes more critical as the 'footprint' area that can be devoted to the multipin module housing decreases, and the functions expected of the signal conditioning circuit within the housing increases. Another problem is to have the optoelectronic leads as short as possible in order to minimize sensitivity of the leads to electromagnetic radiation of high frequency components in the circuit contained within the housing, and to minimize distributed capacitance of the leads since signal response of the leads is inversely proportional to capacitance.

SUMMARY OF THE INVENTION

In accordance with the present invention, an optical-electronic module is provided for use in interfacing the end of a fiberoptic cable and an electronic circuit designed to receive or transmit optical signals. The module is comprised of a nonconducting multipin housing having a base and upright wall portions with connector pins extending away from the space within the wall portions and protruding upwardly into that space. A wall at one end of the frame secures a receptacle for receiving a ferrule at the end of a fiberoptic cable. The receptacle in turn securely holds an optoelectronic device with its base facing the space within the wall portions and its leads protruding into that space. A flexible printed circuit having at least one patterned conductor layer of metal with holes for receiving the upwardly protruding base pins is placed over the pins and folded into the space within the four walls. A tab extending from the flexible printed circuit and having conductors intact with the patterned conductor layer has holes to receive the leads of the optoelectronic device. This tab is folded to an upright position with respect to the multipin base and placed with its holes over the leads, at least one of which is a circuit ground conductor electrically connected to a ground conductor of the flexible printed circuit.

In accordance with a further feature of the invention, the flexible printed circuit may be a multilayer printed circuit in which at least one metal layer (which also extends into the upright tab) is a ground plane.

The ends of the flexible printed circuit extending from the sides of the multipin base are folded into the space within the wall portions with both ends folded over the multipin base, thus surrounding the optoelectronic leads with a ground plane, preferably on the outside of the folded flexible printed circuit. A cover over the wall portions secures the folded flexible printed circuit within the interface housing module.

This arrangement of a folded flexible printed circuit with a ground plane and a tab folded upright inside the interface module housing virtually eliminates any lead length between the base of the optoelectronic device and the folded flexible printed circuit that is not shielded by the ground plane. This permits economical fabrication of the interface connector with a nonconductive plastic housing that is preferably molded out of plastic in three parts: a frame, a base and a cover, with a receptacle for a ferruled end of an optical fiber secured by a wall at one end of the frame.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1 is an exploded view of a plastic multipin interface connector with a metal ST connector having a spring loaded ferrule inserted into a receptacle received in an end wall of a plastic housing and securely holding an optoelectronic device with its leads extending into the plastic housing, and a multilayer printed circuit having a ground plane layer and at least one patterned conductor layer with integrated circuit devices connected thereto. An upright tab of the printed circuit is connected to the leads and the main body of the printed circuit is folded into the plastic housing with the ground plane layer surrounding the printed circuit.

FIG. 2 is a sectional view of the metal ST connector and receptacle shown in FIG. 1 coupled together.

FIG. 4 is a transverse sectional view of the plastic interface connector showing the overlap of the folded printed circuit board in the closed housing.

DESCRIPTION OF PREFERRED EMBODIMENTS

Figure 3A:
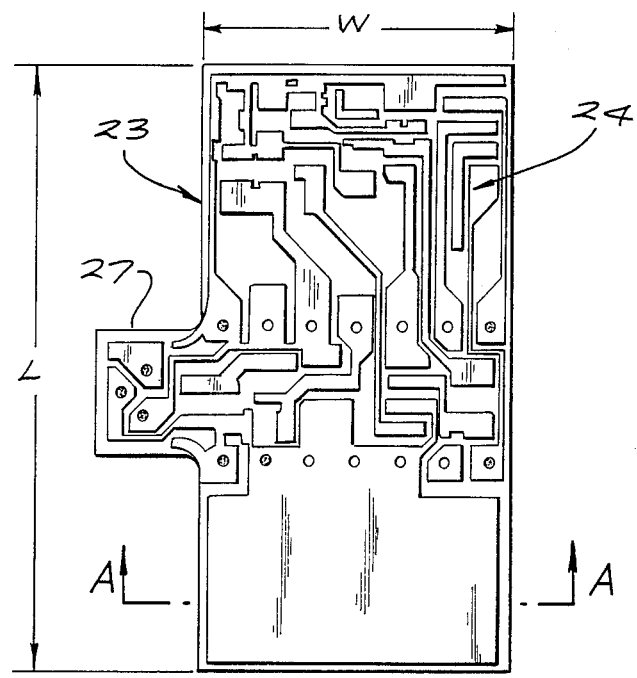
FIG. 3(a) is a plane view of the patterned conductor side of the printed circuit shown in FIG. 1 where solid dots represent connections between the patterned layer and a ground plane layer on the opposite side of the printed circuit layer.

Referring to FIG. 1, a housing for an optical-electronic interface connector fabricated out of plastic is comprised of a frame 10, a base 11 that fits the frame, the base having connector pins 12 protruding on both sides of the base up into the space within the frame and down away from that space, and a cover 13 that fits over the frame. At one end of the frame, the wall 14 of the frame is preferably made thicker than the sides 15, 16 to receive and securely hold a metal receptacle 17 which in turn may receive a ferrule 18 at the end of a fiberoptic cable 19. The receptacle securely holds an optoelectronic device 20 (FIG. 2) with the base 21 of the device 20 facing the interior of the frame 10. While only three device leads 22 are shown protruding into the space within the frame, there are sometimes four, one positive (+), one negative (−) and two ground leads. The receptacle may be molded in place while molding the frame or affixed to the frame in a molded hold, such as by as by pressfitting or gluing it into the hole.

Figure 3B:
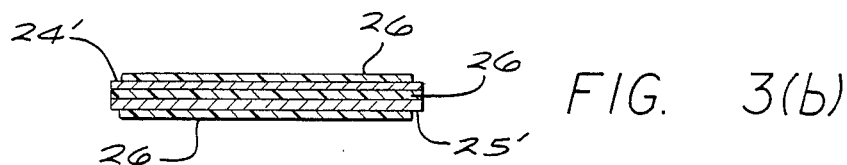
FIG. 3(b) is a sectional view of the printed circuit board of FIG. 3(c) taken along a line A—A.
Figure 3C:
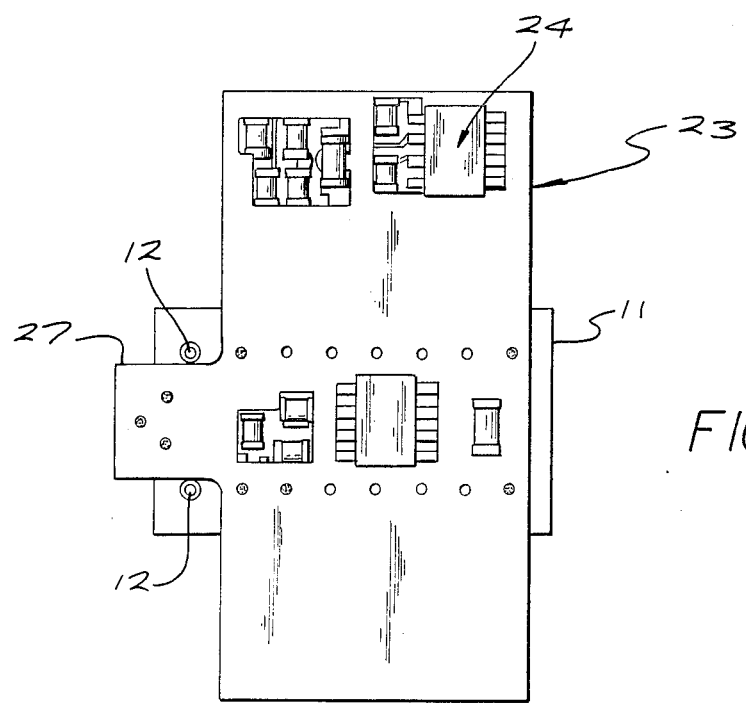
FIG. 3(c) is a plan view of the printed circuit board positioned over the pins in the base of the housing and showing the physical position of integrated circuit and other devices without the pattern of conductors which is shown in FIG. 3(a)

Before affixing the base 11 to the housing frame 10, a flexible multilayer printed circuit (PC) 23 is prepared as shown in a plan view in FIG. 3(a) with one or more integrated circuit packages 24 and other devices shown in FIG. 3(c) mounted on and connected to conductors of the flexible PC having an etched conductor pattern 23a. A typical conductor pattern is shown in FIG. 3(a) by way of example. In practice, the PC 23 may have many conductive layers, the pattern 23a shown in FIG. 3(a) being etched in the surface conductive (Cu) layer 24' shown in FIG. 3(b) which is a sectional view taken on a line A—A in FIG. 3(c). On the other side of the PC there is a conductive (Cu) layer 25' that is unetched, except for pin holes. Between the two conductive layers 24' and 25' there may be additional conductive (Cu) layers that are insulated from each other and the conductive layers 24' and 25' by layers 26 of a suitable insulating and flexible material, such as polyamide. The conductive layers 24' and 25' (and any additional layers not shown) may be interconnected to desired points indicated by solid dots in FIG. 3(c) through etched holes that are plated through or filled with conductive materials. The conductive layers are flexible because they are made of thin copper. All of these conductive and insulating layers are secured to each other by an adhesive.

The flexible PC 23 has a width W less than the inside length of the frame 10 selected to accommodate a desired number of base pins, and a length L greater than twice the inside width of the frame so that the total area of the flexible PC at least approaches, if not exceeds, the total inside surface area of the base 11, two sides 15, 16 and cover 13. This flexible PC is provided with pretinned holes for placement over seven of the eight base pins shown in FIG. 1 in each of two rows protruding into the space within the frame.

The flexible PC is also provided with a tab 27 extending from the left end as viewed in FIG. 3(a) between the two rows of pin holes. That tab is provided with three pretinned holes 23c, one hole for each lead 22 protruding from the optoelectronic device 21 into the space within the frame. Once the flexible PC is placed over the pins 12 in the base 11 and electrically connected to those pins, such as by solder, the tab and the portions of the PC extending well beyond the two rows of pins are folded upwardly to pass between the end and side walls of the frame, but first the leads of the optoelectronic leads are cut to shorter stub length so that the tab folded to its up position may be placed over the leads. Then three patterned conductors are electrically connected to those leads. One lead stub is connected to a positive (+) conductor and another to a negative (−) conductor in the pattern 23a of conductors in the PC. The third lead is connected to a conductor in the pattern 23a which is in turn connected to the unpatterned conductive metal layer 25' which functions as a ground plane for the PC. The connection of the third leads to that ground plane indicated by a solid dot is made through the PC by etching a hole and electroplating it or filling it with conductive material. A fourth lead which is sometimes provided connects the receptacle ground path to the ground plane for electrostatic discharge.

Once the PC has been electrically connected to the pins 12 and leads 22 and placed within the frame 10 with the folded ends of the PC upright between the sides 15 and 16 of the frame, the base is secured to the frame with a suitable adhesive. Then, before securing the cover in place with a suitable adhesive in a similar manner as the base, one of the two ends of the flexible PC is folded toward the other end, and the other end, preferably the longer end, is folder over the one end, as shown in FIG. 4, thus causing the entire space within the plastic frame, and particularly the space around the optoelectronic leads 22, to be surrounded by the ground plane 25' of the flexible PC. Since that ground plane is a copper sheet on the outside of the folded flexible PC, it serves as an electromagnetic shield for the leads 22 and the printed circuit itself. In that manner, the ground plane minimizes the length of unshielded leads 22 from the optoelectronic device 17 to the PC 23 by virtually eliminating any length of the leads from the device to the ground plane of the PC except a minimal length approximately equal to the thickness of the insulating layer 26 on the outside of the ground layer 25'.

As noted above, space between that ground plane layer 25' and the patterned conductor layer 24' is filled with a flexible insulating material, such as polyamide. One or more layers may be added, each insulated from the other in the same manner as the ground plane and the patterned conductor layer. At each added layer, the desired conductor pattern is etched in a conventional manner, and where connections are desired between conductor layers, holes are etched through and filled or at least plated with conductive material. At the holes provided for the pins and leads, copper is etched away around the holes at layers where connections are not to be made. These PC fabrication techniques are conventional and not a part of the invention. What is important to the invention is that the PC be flexible and have at least one metal layer on which a circuit pattern is etched. A further feature is that the PC have at least a second layer of metal which extends in one or more sections through substantially the full length and width of the PC, including the tab. While the one ground plane shown is provided in one continuous section, a ground plane of two or more sections in one or more conductive layers may be provided when, for example, different sections of the printed circuit are to have independent ground references. In either case, the printed circuit is connected to a ground plane through holes in the insulating layer between the patterned conductor layer and the ground plane. These holes are plated or otherwise filled with conductive material. Typical ground plane connections are represented by black dots in FIG. 3a. The ground plane of the preferred embodiment of the invention illustrated is preferably on the outside of the folded flexible PC to also shield the PC, but may in some cases be on the inside. The terms "outside" and "inside" are here used to emphasize that in the preferred embodiment illustrated the outside ground plane surrounds the PC inside. In practice, both the outside ground-plane layer and the inside PC layer of conductive metal are covered with a thin film of insulating polyamide.

The folded PC at the right hand end of the frame 10 as viewed in FIG. 1 (opposite the tab 27 and optoelectronic device leads 22) may also be provided with a tab that folds upright in the same manner as the tab 27 to cover that right hand end of the folded PC with the ground-plane shield, but that is not as important as having the upright tab 27 shield the most sensitive part of the PC, namely the leads 22 and conductors of the PC connected directly to those leads, particularly in the case of an electronic interface module for a receiver.

Although particular embodiments of the invention have been described and illustrated herein, it is recognized that modifications and variations may readily occur to those skilled in the art. Consequently, it is intended that the claims be interpreted to cover such modifications and variations.

I claim:

1. A module for providing an interface between an optoelectronic device and an electronic system, said device having leads extending therefrom comprising
    a flexible printed circuit having at least one layer of patterned conductors on a substrate layer of flexible nonconductive material, and electronic devices connected to said pattern of conductors,
    a housing made of nonconductive material for enclosing said flexible printed circuit while folded along at least one line to fit within said housing, said housing having
        said optoelectronic device being optically accessible through a wall thereof, and said leads extending into said housing,
        pins protruding both into and out of said housing, and at least some of said pins protruding into said housing passing through holes in said flexible printed circuit, and
        means for making electrical connections to said flexible printed circuit through said pins at points where pins protrude through said holes in said flexible printed circuit,
    said flexible printed circuit having an area for making connections of said leads to conductors in said flexible printed circuit.

2. A module as defined in claim 1 wherein all of said pins connected to said flexible printed circuit protrude through a base of said housing, said base being perpendicular to a wall portion, and said device protrudes through said wall portion, and wherein said area for making connections of said leads to said conductors in said flexible printed circuit is on a tab folded to a position perpendicular to said base, said tab and said wall portion being juxtaposed and said tab having holes at points in said conductors of said flexible printed circuit placed over said leads, and further means for making electrical connections between said leads and said conductors of said flexible printed circuit on said tab, thereby minimizing the length of said leads from said device to said folded flexible printed circuit.

3. A module as defined in claim 2 wherein said folded flexible printed circuit includes a layer of metal insulated from said patterned layer of conductors, said layer of metal extending onto said tab to surround said lead holes and make electrical connection to at least one of said leads, thereby providing a circuit ground plane for said flexible printed circuit which extends into said tab around said lead holes.

4. A module as defined in claim 3 wherein said layer of metal on said substrate layer is on the side of said substrate layer facing the interior of said housing thereby surrounding said flexible printed circuit and connecting conductors on said tab with said layer of metal to provide a shield against electromagnetic interference from sources outside of said housing.

5. A module as defined in claim 4 wherein said flexible printed circuit is folded along two lines, on either side of said tab, a first side of said folded flexible printed circuit being folded over at least some of said protruding pins, said flexible printed circuit being connected to said protruding pins, and a second side of said folded flexible printed circuit being folded to a juxtaposition with said first side of said folded flexible printed circuit board.

6. A module as defined in claim 5 wherein said juxtaposed sides of said folded flexible printed circuit are perpendicular to said folded tab, said folded tab being in juxtaposition with said folded ends.

7. A module as defined in claim 1 wherein said housing is made of nonconductive material in three parts, namely
    a frame having a hole in one wall portion for receiving said optoelectronic device with said leads extending into said frame,
    a base having said pins protruding into and out of said frame, and having said flexible printed circuit placed over said base with at least some pins protruding into said frame passing through holes in said flexible circuit being folded over said protruding pins disposed in said base along two lines parallel to two opposite sides of said base, and
    a cover over said frame on a side thereof opposite said base, said three parts being affixed to each other after assembly.

8. A module as defined in claim 7 wherein said area for making connections between said leads and said conductors in said flexible printed circuit is on a tab folded to a position perpendicular to said base, said tab and said wall portion being juxtaposed and said tab having holes at points in said conductors of said flexible printed circuit placed over said leads, further comprising means for making electrical connections between said leads and said conductors of said flexible printed circuit on said tab, thereby minimizing the length of said leads from said optoelectronic device to said folded flexible printed circuit.

9. A module for providing an optical-electronic interface between the end of a fiberoptic cable and an electronic circuit comprised of a folded flexible printed circuit within a nonconductive housing having connector pins passing through the base thereof, said pins being connected to points in said printed circuit, said flexible printed circuit having an upright tab and comprising at least one patterned conductor layer with patterned conductors extending onto said upright tab, and an optoelectronic device protruding through a wall of said nonconductive housing, said optoelectronic device having leads extending from a base thereof into the interior of said housing, said device base being in juxtaposition with said tab, and said leads being connected to said patterned conductors extending into said tab from said folded flexible printed circuit, thereby minimizing the length of leads from said optoelectronic device to said folded flexible printed circuit.

10. A multipin interface module as defined in claim 9 wherein said folded flexible printed circuit is comprised of a thin layer of metal and at least one thin patterned layer of metal separated by a thin layer of flexible electrical insulating material to provide a circuit pattern of conductors and a ground plane, and layers of flexible electrical insulating material on the outside of said metal layers, thereby providing a flexible printed circuit which may be fabricated in a single plane and folded into said plastic housing.

11. A multipin interface module as defined in claim 10 wherein said nonconductive housing is comprised of a plastic frame having a hole at one end of receive and secure a metal receptacle having said optoelectronic device held with its base facing the interior space of said frame and conductive leads of said device protruding into said interior space, said upright tab of said printed circuit having holes to receive said leads, said tab being positioned on said leads adjacent to said base of said device, said leads being electrically connected to said patterned layer of metal to provide electrical connection to said ground plane and to said patterned layer of conductors.

12. A multipin interface module as defined in claim 11 wherein said ground plane layer of metal is on the outside of said flexible printed circuit folded in said housing, and said ground plane layer of metal extends over said intact tab, thereby shielding said flexible printed circuit beginning at a position on said leads next to said optoelectronic device.

13. An optical-electronic module for interfacing the end of a fiberoptic cable and an electronic circuit of a receiver or transmitter, said module having a nonconductive multipin housing comprising a frame, a base with connector pins extending away from the space within said frame and protruding upwardly into said space, a hole in a wall at one end of said frame securing a receptacle for holding an optoelectronic device and receiving a ferrule at the end of a fiberoptic cable, said optoelectronic device having leads protruding into said space within said frame, a flexible multilayer printed circuit having a ground plane layer of metal and at least one patterned conductor plane layer of metal with holes through both layers to receive said upwardly protruding pins when said flexible printed circuit is placed over said upwardly protruding pins with said ground plane layer of said flexible printed circuit facing said base, said pins being electrically connected to selected points in said patterned conductor layer, said flexible printed circuit having a tab intact with said ground plane layer and said patterned conductor layer, and having holes receiving said leads of said optoelectronic device, said tab being folded to an upright position with respect to said base of said housing and placed with its holes over said leads in juxtaposition with said optoelectronic device, said leads being electrically connected to patterned conductors extending onto said tab from said flexible multilayer printed circuit, at least one of which is a circuit ground conductor electrically connected to said ground plane layer, portions of said flexible printed circuit extending beyond opposite sides of said base being folded upwardly into space within said frame over said base with one end folded over the other, thus shielding the optoelectronic lead connections with a ground plane that extends from said optoelectronic device leads over said folded flexible multilayer printed circuit.

* * * * *